United States Patent
Wei et al.

(10) Patent No.: US 11,342,217 B1
(45) Date of Patent: May 24, 2022

(54) METHOD FOR IMPROVING HDP FILLING DEFECTS THROUGH STI ETCHING PROCESS

(71) Applicant: Shanghai Huali Microelectronics Corporation, Shanghai (CN)

(72) Inventors: Zhengying Wei, Shanghai (CN); Xuedong Fan, Shanghai (CN); Zhiyong Wu, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 33 days.

(21) Appl. No.: 17/142,623

(22) Filed: Jan. 6, 2021

(30) Foreign Application Priority Data

Nov. 11, 2020 (CN) .......................... 202011252721.3

(51) Int. Cl.
*H01L 21/762* (2006.01)
*H01L 21/768* (2006.01)

(52) U.S. Cl.
CPC .. *H01L 21/76224* (2013.01); *H01L 21/76802* (2013.01)

(58) Field of Classification Search
CPC .................... H01L 21/76224; H01L 21/76802
See application file for complete search history.

(56) References Cited

U.S. PATENT DOCUMENTS

| | | | | |
|---|---|---|---|---|
| 8,652,931 B1* | 2/2014 | Luo | ..................... | H01L 27/1463 438/424 |
| 2003/0045131 A1* | 3/2003 | Verbeke | ............ | H01L 21/67167 438/795 |
| 2007/0087518 A1* | 4/2007 | Ochi | ................... | H01L 27/1463 257/E21.546 |
| 2007/0093071 A1* | 4/2007 | Verhaverbeke | ... | H01L 21/67173 430/269 |
| 2008/0035963 A1* | 2/2008 | Kwon | ................ | H01L 27/1463 257/E27.131 |
| 2008/0251821 A1* | 10/2008 | Ko | ..................... | H01L 27/14609 257/292 |
| 2009/0130820 A1* | 5/2009 | Kim | .................. | H01L 21/76224 257/E21.546 |
| 2010/0025569 A1* | 2/2010 | Matsumoto | ....... | H01L 27/14689 257/E31.073 |
| 2010/0140668 A1* | 6/2010 | Stevens | ............ | H01L 27/14689 257/225 |
| 2010/0252870 A1* | 10/2010 | Lin | ................... | H01L 27/14683 438/424 |

(Continued)

*Primary Examiner* — Bac H Au

(74) *Attorney, Agent, or Firm* — Banner & Witcoff, Ltd.

(57) ABSTRACT

The present disclosure provides a method for improving HDP filling defects through an STI etching process, comprises a wafer uniformly distributed with pixel areas and logical areas, and dividing the wafer into quadrants 1 to 4; placing the second quadrants in an etching chamber in a manner of facing to a cantilever of an etching machine; etching the wafer to form STI areas with the same depth in the pixel areas and the logical areas of the quadrants 1 to 4; removing the wafer from the etching machine and covering the STI areas of the pixel areas with a photoresist; placing the wafer on an electrostatic chuck of the etching chamber again, and enabling any quadrant except the second quadrant to face to the cantilever; continuously etching the STI areas of the logical areas of the quadrants 1 to 4 to form deep STI areas.

3 Claims, 5 Drawing Sheets

(56) References Cited

U.S. PATENT DOCUMENTS

| | | | | |
|---|---|---|---|---|
| 2011/0061810 A1* | 3/2011 | Ganguly | ............ | H01L 21/67167 |
| | | | | 156/345.27 |
| 2011/0061812 A1* | 3/2011 | Ganguly | ............ | H01L 21/68785 |
| | | | | 156/345.1 |
| 2011/0065276 A1* | 3/2011 | Ganguly | ............ | H01L 21/67207 |
| | | | | 257/E21.257 |
| 2014/0349464 A1* | 11/2014 | Yang | ................ | H01L 21/3081 |
| | | | | 438/427 |

\* cited by examiner

METHOD FOR IMPROVING HDP FILLING DEFECTS THROUGH STI ETCHING PROCESS

CROSS-REFERENCE TO RELATED APPLICATIONS

This application claims priority to Chinese Patent Application No. CN 202011252721.3, filed on Nov. 11, 2020, and entitled "Method for Improving HDP Filling Defects Through STI Etching Process", the disclosure of which is incorporated herein by reference in its entirety.

TECHNICAL FIELD

The present application relates to the technical field of semiconductors, in particular to a method for improving HDP filling defects through the STI etching process.

BACKGROUND

At present, in the process of CIS products, due to the process requirements, the Shallow-Trench Isolation (STI) depths of pixel areas and logical areas are different, and etching is performed in two steps; the first step is to simultaneously etch the STI areas of the pixel areas and the logical areas; the second step is to cover the pixel areas with a photoresist, and then continuously etch the STI areas of the logical areas. Since the STI areas in the logical areas are deeper and High Density Plasma (HDP) filling is adopted in the filling process, defects of edge voids towards certain directions or positions will appear for the main reason that the depth of the STI areas at these positions is larger than that at other positions. The depth of the STI areas at these positions is larger for the main reason that a cantilever position is designed on an etching machine such as Kiyo. At present, both STI and HDP are processed at selected machines with better process capability to reduce void defects. However, with the increase of product input and the demand of machine maintenance, such control method can no longer meet the demand of product delivery.

Therefore, it is necessary to provide a new method to solve the problem.

BRIEF SUMMARY

According to one embodiment of the current disclosure, the method at least includes: step 1: providing a wafer, the wafer being uniformly distributed with pixel areas and logical areas; step 2: dividing a surface of the wafer into a first quadrant, a second quadrant, a third quadrant and a fourth quadrant by taking a circle center of the wafer as an origin of a rectangular coordinate system; step 3: placing the wafer on an electrostatic chuck of an etching chamber of an etching machine, and enabling the second quadrant of the wafer to face to a cantilever of the etching machine; step 4: synchronously performing STI etching to the pixel areas and the logical areas of the first quadrant, the second quadrant, the third quadrant and the fourth quadrant of the wafer to respectively form STI areas with the same depth in the pixel areas and the logical areas of the first quadrant, the second quadrant, the third quadrant and the fourth quadrant, the depth of the STI areas being H; step 5: removing the wafer from the etching machine, and covering the STI areas of the pixel areas of the first quadrant, the second quadrant, the third quadrant and the fourth quadrant of the wafer with a photoresist; step 6: placing the wafer on the electrostatic chuck of the etching chamber of the etching machine again, and enabling any one of other three quadrants except the second quadrant of the wafer to face to the cantilever of the etching machine; step 7: continuously etching the STI areas of the logical areas of the first quadrant, the second quadrant, the third quadrant and the fourth quadrant of the wafer to form deep STI areas, the depth of the deep STI areas being H+h.

In some examples, in step 6, the fourth quadrant of the wafer is enabled to face to the cantilever of the etching machine.

The present application further provides a method for improving HDP filling defects through an STI etching process. The method at least includes:

step 1: providing a wafer, the wafer being uniformly distributed with pixel areas and logical areas;

step 2: dividing a surface of the wafer into a first quadrant, a second quadrant, a third quadrant and a fourth quadrant by taking a circle center of the wafer as an origin of a rectangular coordinate system;

step 3: placing the wafer on an electrostatic chuck of an etching chamber of an etching machine, and enabling the second quadrant of the wafer to face to a cantilever of the etching machine; then synchronously performing STI etching to the pixel areas and the logical areas of the first quadrant, the second quadrant, the third quadrant and the fourth quadrant of the wafer to respectively form STI areas with a depth of ¼ H in the pixel areas and the logical areas of the first quadrant, the second quadrant, the third quadrant and the fourth quadrant;

step 4: removing the wafer from the etching chamber, rotating the wafer for 90°, then placing the wafer on the electrostatic chuck of the etching chamber again, and enabling the first quadrant of the wafer to face to the cantilever of the etching machine; then continuously and synchronously etching the STI areas of the pixel areas and the logical areas of the first quadrant, the second quadrant, the third quadrant and the fourth quadrant of the wafer till the depth reaches 2/4 H;

step 5: removing the wafer from the etching chamber, rotating the wafer for 90°, then placing the wafer on the electrostatic chuck of the etching chamber again, and enabling the fourth quadrant of the wafer to face to the cantilever of the etching machine; then continuously and synchronously etching the STI areas of the pixel areas and the logical areas of the first quadrant, the second quadrant, the third quadrant and the fourth quadrant of the wafer till the depth reaches ¾ H;

step 6: removing the wafer from the etching chamber, rotating the wafer for 90°, then placing the wafer on the electrostatic chuck of the etching chamber again, and enabling the third quadrant of the wafer to face to the cantilever of the etching machine; then continuously and synchronously etching the STI areas of the pixel areas and the logical areas of the first quadrant, the second quadrant, the third quadrant and the fourth quadrant of the wafer till the depth reaches H;

step 7: removing the wafer from the etching machine, and covering the STI areas of the pixel areas of the first quadrant, the second quadrant, the third quadrant and the fourth quadrant of the wafer with a photoresist;

step 8: placing the wafer on the electrostatic chuck of the etching chamber of the etching machine, and enabling the second quadrant of the wafer to face to the cantilever of the etching machine; then continuously etching the STI areas of the logical areas of the first quadrant, the second quadrant, the third quadrant and the fourth quadrant of the wafer till the depth reaches H+¼ h;

step 9: removing the wafer from the etching chamber, rotating the wafer for 90°, then placing the wafer on the electrostatic chuck of the etching chamber again, and enabling the first quadrant of the wafer to face to the cantilever of the etching machine; then continuously etching the STI areas of the logical areas of the first quadrant, the second quadrant, the third quadrant and the fourth quadrant of the wafer till the depth reaches H+²⁄₄ h;

step 10: removing the wafer from the etching chamber, rotating the wafer for 90°, then placing the wafer on the electrostatic chuck of the etching chamber again, and enabling the fourth quadrant of the wafer to face to the cantilever of the etching machine; then continuously etching the STI areas of the logical areas of the first quadrant, the second quadrant, the third quadrant and the fourth quadrant of the wafer till the depth reaches H+¾ h;

step 11: removing the wafer from the etching chamber, rotating the wafer for 90°, then placing the wafer on the electrostatic chuck of the etching chamber again, and enabling the third quadrant of the wafer to face to the cantilever of the etching machine; then continuously etching the STI areas of the logical areas of the first quadrant, the second quadrant, the third quadrant and the fourth quadrant of the wafer till the depth reaches H+h.

As described above, the method for improving HDP filling defects through the STI etching process provided by the present application has the following beneficial effects: in the present application, etching is performed in two steps; the first step is to simultaneously etch the pixel areas and the logical areas; the second step is to cover the pixel areas with a photoresist, and then continuously etch the logical areas; in the present application, the in-plane depth uniformity is improved through angle matching during STI etching and deep STI etching or angle rotation during STI and deep STI etching, thus preventing voids from appearing during HDP filling.

DETAILED DESCRIPTION

The embodiments of the present disclosure will be described below through specific examples, and those skilled in the art can easily understand other advantages and effects of the present disclosure from the content disclosed in the description. The present disclosure may also be implemented or applied through other different specific embodiments, and various details in the description may also be modified or changed based on different viewpoints and applications without departing from the spirit of the present disclosure.

It should be noted that the drawings provided in the embodiments are only used for schematically describing the basic concept of the present application, thus only illustrate components related to the present disclosure, and are not drawn according to the number, shape and size of the components in the actual implementation. The form, number and scale of the components in the actual implementation may be freely changed and the layout of the components may be more complex.

Embodiment 1

Figure 6:
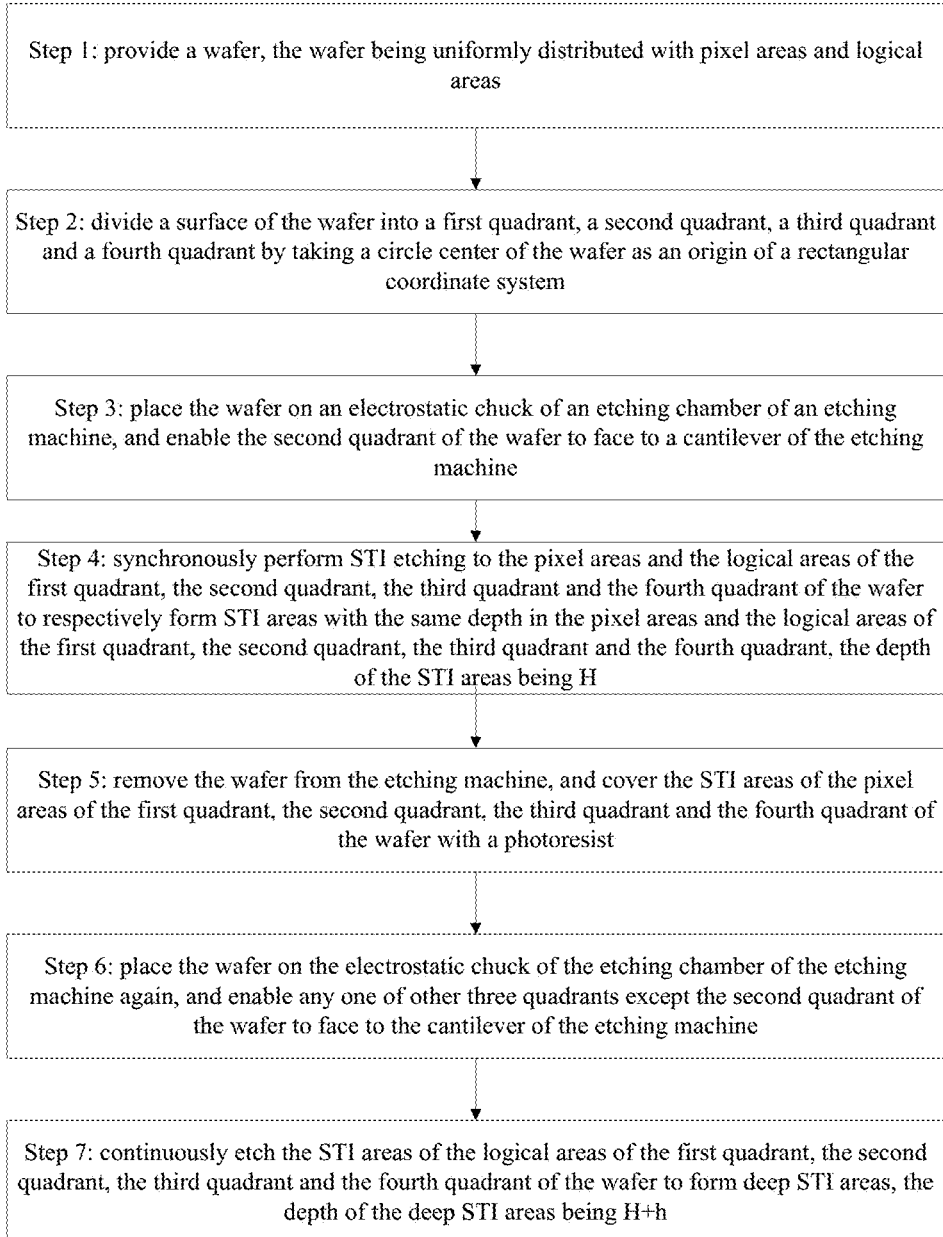
FIG. 6 illustrates a flowchart of a method for improving HDP filling defects through an STI etching process provided by embodiment 1 of the present disclosure.

The present disclosure provides a method for improving HDP filling defects through an STI etching process. Referring to FIG. 6, it illustrates a flowchart of the method for improving HDP filling defects through the STI etching process provided by embodiment 1 of the present disclosure. The method at least includes the following steps:

In step 1, a wafer is provided. The wafer is uniformly distributed with pixel areas and logical areas.

Figure 4A:
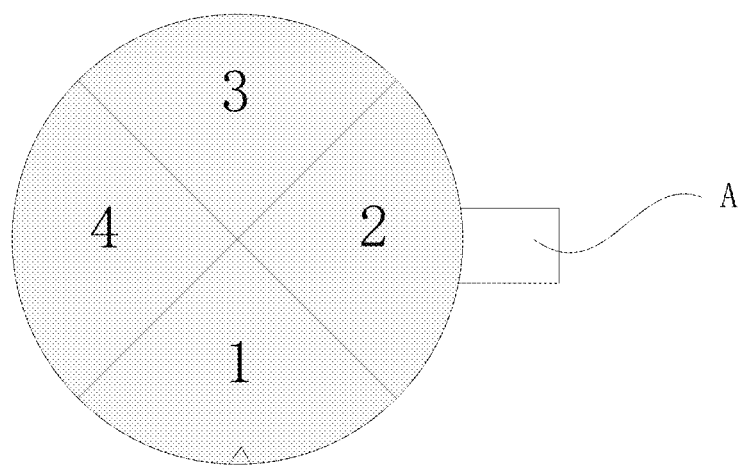
FIG. 4a illustrates a top schematic view when a second quadrant of a wafer is enabled to face to a cantilever of an etching machine in embodiment 1 of the present disclosure.

In step 2, a surface of the wafer is divided into a first quadrant, a second quadrant, a third quadrant and a fourth quadrant by taking a circle center of the wafer as an origin of a rectangular coordinate system. Referring to FIG. 4a, reference signs 1, 2, 3 and 4 on the surface of the wafer respectively represent the first quadrant, the second quadrant, the third quadrant and the fourth quadrant. Since pixel areas and logical areas are uniformly distributed on the wafer, the pixel areas and the logical areas are distributed in the first quadrant, the second quadrant, the third quadrant and the fourth quadrant of the wafer.

In step 3, the wafer is placed on an electrostatic chuck of an etching chamber of an etching machine, and the second quadrant of the wafer is enabled to face to a cantilever of the etching machine. Referring to FIG. 4a, it illustrates a top schematic view when the second quadrant of the wafer is enabled to face to the cantilever of the etching machine in embodiment 1 of the present application. Reference sign A in FIG. 4a represents the cantilever.

Figure 1:
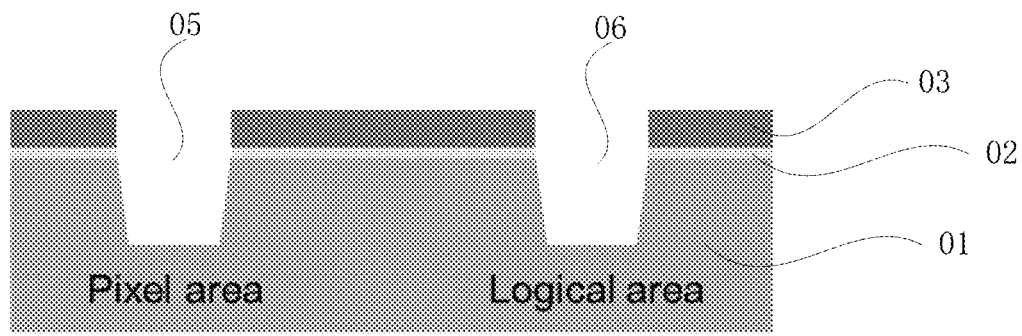
FIG. 1 illustrates a cross-sectional structural schematic view of a pixel area and a logical area in embodiment 1 of the present disclosure.

In step 4, STI etching is synchronously performed to the pixel areas and the logical areas of the first quadrant, the second quadrant, the third quadrant and the fourth quadrant of the wafer to respectively form STI areas with the same depth in the pixel areas and the logical areas of the first quadrant, the second quadrant, the third quadrant and the fourth quadrant. The depth of the STI areas is H. Referring to FIG. 1, it illustrates a cross-sectional schematic view of a pixel area and a logical area in embodiment 1 of the present application. The first quadrant, the second quadrant, the third quadrant and the fourth quadrant all include the pixel areas and the logical areas. Synchronous etching means simultaneous etching. The STI areas 05 are formed in the pixel areas and the STI areas 06 are formed in the logical areas. Because of synchronous etching, the STI areas 05 and the STI areas 06 have the same depth H. After etching, the bottoms of the STI areas are located on a substrate 01 on the wafer, and before etching, the substrate is also provided with a first layer structure 02 and a second layer structure 03.

Figure 2:
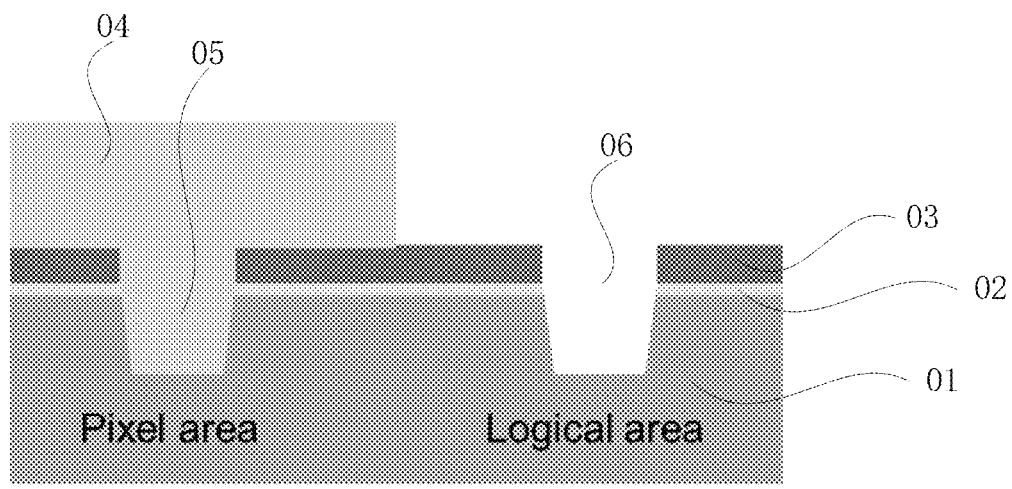
FIG. 2 illustrates a cross-sectional structural schematic view after STI areas of pixel areas of a wafer are covered with a photoresist in embodiment 1 of the present disclosure.

In step 5, the wafer is removed from the etching machine, and the STI areas of the pixel areas of the first quadrant, the second quadrant, the third quadrant and the fourth quadrant of the wafer are covered with a photoresist. Referring to FIG. 2, it illustrates a cross-sectional structural schematic view after the STI areas of the pixel areas of the wafer are covered with the photoresist in embodiment 1 of the present application. In step 5, the wafer is removed from the etching chamber, then is removed from the etching machine and is spin-coated with a photoresist layer, the spin-coated photoresist layer simultaneously covers the STI areas of the pixel areas and the logical areas, then the STI areas of the logical areas of the first quadrant, the second quadrant, the third quadrant and the fourth quadrant are exposed through development, only the STI areas of the pixel areas are covered with the photoresist 04, and a structure illustrated in FIG. 2 is formed.

Figure 4B:
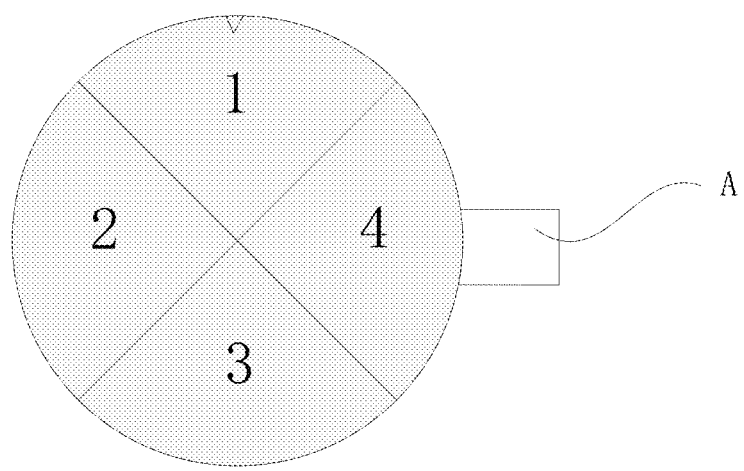
FIG. 4b illustrates a top schematic view when a fourth quadrant of a wafer is enabled to face to a cantilever of an etching machine in embodiment 1 of the present disclosure.

In step 6, the wafer is placed on the electrostatic chuck of the etching chamber of the etching machine again, and any one of other three quadrants except the second quadrant of the wafer is enabled to face to the cantilever of the etching machine. Further, in the present application, in step 6 of the present embodiment, the fourth quadrant of the wafer is enabled to face to the cantilever of the etching machine. Referring to FIG. 4b, it illustrates a top schematic view when the fourth quadrant of the wafer is enabled to face to the cantilever of the etching machine in embodiment 1 of the present application. In other words, in step 6, the wafer is rotated for 180° and then is placed on the electrostatic chuck. Reference sign A in FIG. 4b represents the cantilever.

Figure 3:
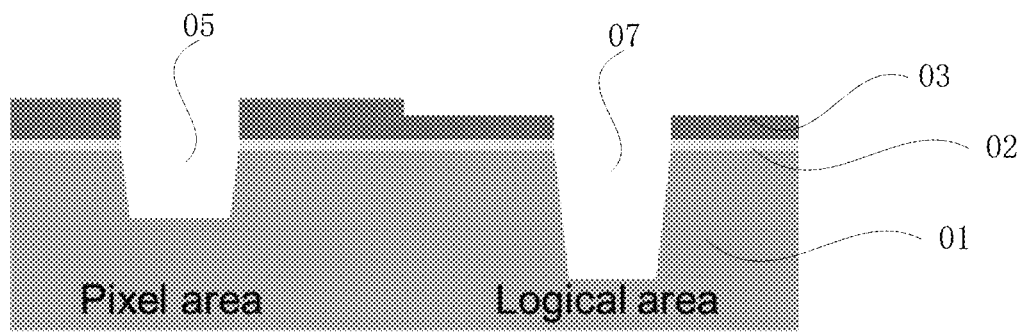
FIG. 3 illustrates a cross-sectional structural schematic view after deep STI areas are formed after STI areas of logical areas are continuously etched in embodiment 1 of the present disclosure.

In step 7, the STI areas of the logical areas of the first quadrant, the second quadrant, the third quadrant and the fourth quadrant of the wafer are continuously etched to form deep STI areas. The depth of the deep STI areas is H+h. Referring to FIG. 3, it illustrates a cross-sectional structural schematic view after deep STI areas 07 are formed after the STI areas of the logical areas are continuously etched in embodiment 1 of the present application.

Embodiment 2

The present disclosure further provides a method for improving HDP filling defects through an STI etching process. The method at least includes the following steps:

In step 1, a wafer is provided. The wafer is uniformly distributed with pixel areas and logical areas.

In step 2, a surface of the wafer is divided into a first quadrant, a second quadrant, a third quadrant and a fourth quadrant by taking a circle center of the wafer as an origin of a rectangular coordinate system. The operation principles of step 1 and step 2 in the present embodiment are the same as the operation principles of step 1 and step 2 in embodiment 1 of the present disclosure.

Figure 5A:
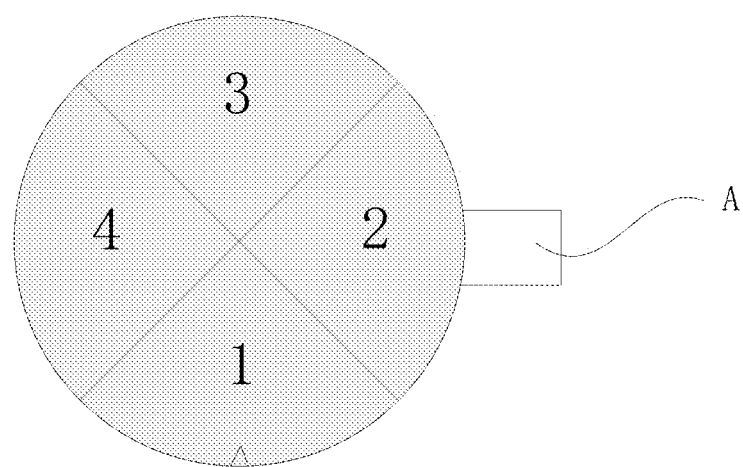
FIG. 5a illustrates a top schematic view when a second quadrant of a wafer is enabled to face to a cantilever of an etching machine in embodiment 2 of the present disclosure.

In step 3, the wafer is placed on an electrostatic chuck of an etching chamber of an etching machine, and the second quadrant of the wafer is enabled to face to a cantilever of the etching machine. Referring to FIG. 5a, it illustrates a top schematic view when the second quadrant of the wafer is enabled to face to the cantilever A of the etching machine in embodiment 2 of the present application. Then STI etching is synchronously performed to the pixel areas and the logical areas of the first quadrant, the second quadrant, the third quadrant and the fourth quadrant of the wafer to respectively form STI areas with a depth of ¼ H in the pixel areas and the logical areas of the first quadrant, the second quadrant, the third quadrant and the fourth quadrant. In step 3, synchronous etching means simultaneous etching, STI areas with a depth of ¼ H are formed in the pixel areas, and STI areas with a depth of ¼ H are also formed in the logical areas.

Figure 5B:
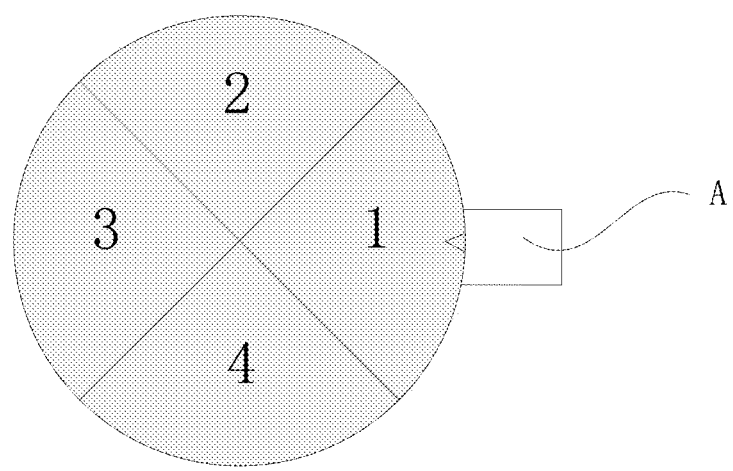
FIG. 5b illustrates a top schematic view when a first quadrant of a wafer is enabled to face to a cantilever of an etching machine in embodiment 2 of the present disclosure.

In step 4, the wafer is removed from the etching chamber, the wafer is rotated for 90°, then the wafer is placed on the electrostatic chuck of the etching chamber again, and the first quadrant of the wafer is enabled to face to the cantilever of the etching machine. Referring to FIG. 5b, it illustrates a top schematic view when the first quadrant of the wafer is enabled to face to the cantilever A of the etching machine in embodiment 2 of the present application. Then the STI areas of the pixel areas and the logical areas of the first quadrant, the second quadrant, the third quadrant and the fourth quadrant of the wafer are continuously and synchronously etched till the depth reaches 2/4 H.

Figure 5C:
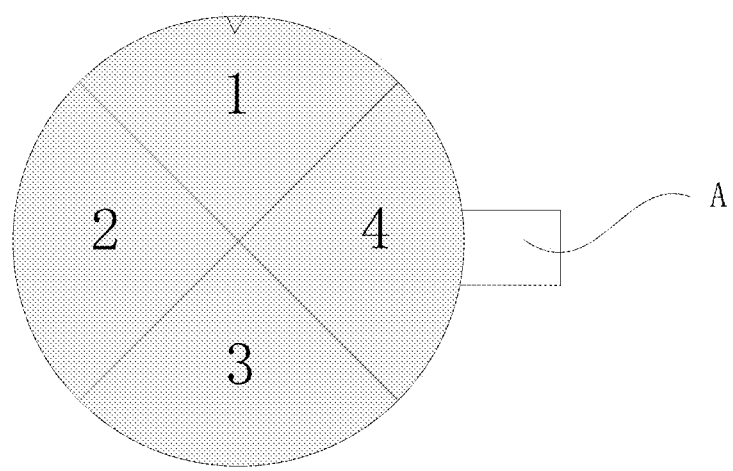
FIG. 5c illustrates a top schematic view when a fourth quadrant of a wafer is enabled to face to a cantilever of an etching machine in embodiment 2 of the present disclosure.

In step 5, the wafer is removed from the etching chamber, the wafer is rotated for 90°, then the wafer is placed on the electrostatic chuck of the etching chamber again, and the fourth quadrant of the wafer is enabled to face to the cantilever of the etching machine. Referring to FIG. 5c, it illustrates a top schematic view when the fourth quadrant of the wafer is enabled to face to the cantilever A of the etching machine in embodiment 2 of the present application. Then the STI areas of the pixel areas and the logical areas of the first quadrant, the second quadrant, the third quadrant and the fourth quadrant of the wafer are continuously and synchronously etched till the depth reaches ¾ H.

Figure 5D:
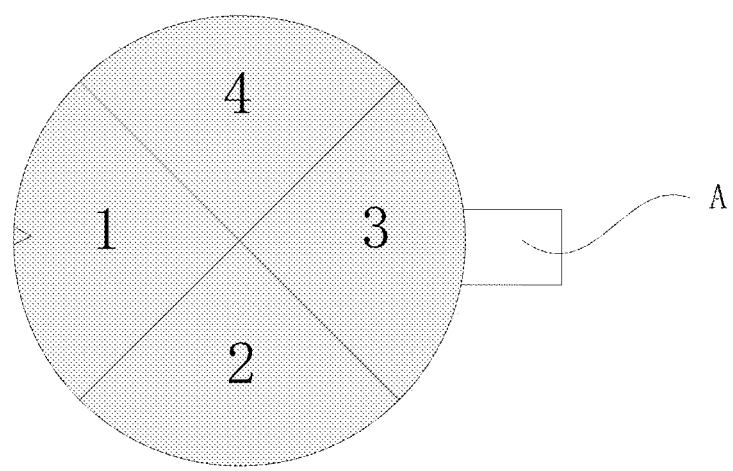
FIG. 5d illustrates a top schematic view when a third quadrant of a wafer is enabled to face to a cantilever of an etching machine in embodiment 2 of the present disclosure.

In step 6, the wafer is removed from the etching chamber, the wafer is rotated for 90°, then the wafer is placed on the electrostatic chuck of the etching chamber again, and the third quadrant of the wafer is enabled to face to the cantilever of the etching machine. Referring to FIG. 5d, it illustrates a top schematic view when the third quadrant of the wafer is enabled to face to the cantilever A of the etching machine in embodiment 2 of the present application. Then the STI areas of the pixel areas and the logical areas of the first quadrant, the second quadrant, the third quadrant and the fourth quadrant of the wafer are continuously and synchronously etched till the depth reaches H.

In step 7, the wafer is removed from the etching machine, and the STI areas of the pixel areas of the first quadrant, the second quadrant, the third quadrant and the fourth quadrant of the wafer are covered with a photoresist. In step 7, the depth of the STI areas of the pixel areas covered by the photoresist is H, and the depth of the STI areas of the logical areas not covered with the photoresist is also H.

In step 8, the wafer is placed on the electrostatic chuck of the etching chamber of the etching machine, and the second quadrant of the wafer is enabled to face to the cantilever of the etching machine; then the STI areas of the logical areas of the first quadrant, the second quadrant, the third quadrant and the fourth quadrant of the wafer are continuously etched till the depth reaches H+¼ h.

In step 9, the wafer is removed from the etching chamber, the wafer is rotated for 90°, then the wafer is placed on the electrostatic chuck of the etching chamber again, and the first quadrant of the wafer is enabled to face to the cantilever of the etching machine; then the STI areas of the logical areas of the first quadrant, the second quadrant, the third quadrant and the fourth quadrant of the wafer are continuously etched till the depth reaches H+⅔ h.

In step 10, the wafer is removed from the etching chamber, the wafer is rotated for 90°, then the wafer is placed on the electrostatic chuck of the etching chamber again, and the fourth quadrant of the wafer is enabled to face to the cantilever of the etching machine; then the STI areas of the logical areas of the first quadrant, the second quadrant, the third quadrant and the fourth quadrant of the wafer are continuously etched till the depth reaches H+¾ h.

In step 11, the wafer is removed from the etching chamber, the wafer is rotated for 90°, then the wafer is placed on the electrostatic chuck of the etching chamber again, and the third quadrant of the wafer is enabled to face to the cantilever of the etching machine; then the STI areas of the logical areas of the first quadrant, the second quadrant, the third quadrant and the fourth quadrant of the wafer are continuously etched till the depth reaches H+h.

To sum up, in the present disclosure, etching is performed in two steps; the first step is to simultaneously etch the pixel areas and the logical areas; the second step is to cover the pixel areas with a photoresist, and then continuously etch the logical areas; in the present application, the in-plane depth uniformity is improved through angle matching during STI etching and deep STI etching or angle rotation during STI and deep STI etching, thus preventing voids from appearing during HDP filling. Therefore, the present application effectively overcomes various disadvantages in the prior art and thus has a great industrial utilization value.

The above embodiments are used for exemplarily describing the principle and effect of the present disclosure only, instead of limiting the present disclosure. Those skilled in the art may modify or change the above embodiments without going beyond the spirit and scope of the present disclosure. Therefore, all equivalent modifications or changes made by those skilled in the art without departing from the spirit and technical concept disclosed in the present disclosure shall still be covered by the claims of the present disclosure.

What is claimed is:

1. A method for improving HDP filling defects through an STI etching process, wherein the method at least comprises:
   step 1: providing a wafer, the wafer being uniformly distributed with pixel areas and logical areas;
   step 2: dividing a surface of the wafer into a first quadrant, a second quadrant, a third quadrant and a fourth quadrant by taking a circle center of the wafer as an origin of a rectangular coordinate system;
   step 3: placing the wafer on an electrostatic chuck of an etching chamber of an etching machine, and enabling the second quadrant of the wafer to face to a cantilever of the etching machine;
   step 4: synchronously performing STI etching to the pixel areas and the logical areas of the first quadrant, the second quadrant, the third quadrant and the fourth quadrant of the wafer to respectively form STI areas with the same depth in the pixel areas and the logical areas of the first quadrant, the second quadrant, the third quadrant and the fourth quadrant, the depth of the STI areas being H;
   step 5: removing the wafer from the etching machine, and covering the STI areas of the pixel areas of the first quadrant, the second quadrant, the third quadrant and the fourth quadrant of the wafer with a photoresist;
   step 6: placing the wafer on the electrostatic chuck of the etching chamber of the etching machine again, and enabling any one of other three quadrants except the second quadrant of the wafer to face to the cantilever of the etching machine; and
   step 7: continuously etching the STI areas of the logical areas of the first quadrant, the second quadrant, the third quadrant and the fourth quadrant of the wafer to form deep STI areas, the depth of the deep STI areas being H+h.

2. The method for improving HDP filling defects through the STI etching process according to claim 1, wherein in step 6, the fourth quadrant of the wafer is enabled to face to the cantilever of the etching machine.

3. A method for improving HDP filling defects through an STI etching process, wherein the method at least comprises:
   step 1: providing a wafer, the wafer being uniformly distributed with pixel areas and logical areas;
   step 2: dividing a surface of the wafer into a first quadrant, a second quadrant, a third quadrant and a fourth quadrant by taking a circle center of the wafer as an origin of a rectangular coordinate system;
   step 3: placing the wafer on an electrostatic chuck of an etching chamber of an etching machine, and enabling the second quadrant of the wafer to face to a cantilever of the etching machine; then synchronously performing STI etching to the pixel areas and the logical areas of the first quadrant, the second quadrant, the third quadrant and the fourth quadrant of the wafer to respectively form STI areas with a depth of ¼ H in the pixel areas and the logical areas of the first quadrant, the second quadrant, the third quadrant and the fourth quadrant;
   step 4: removing the wafer from the etching chamber, rotating the wafer for 90°, then placing the wafer on the electrostatic chuck of the etching chamber again, and enabling the first quadrant of the wafer to face to the cantilever of the etching machine; then continuously and synchronously etching the STI areas of the pixel areas and the logical areas of the first quadrant, the second quadrant, the third quadrant and the fourth quadrant of the wafer till the depth reaches ⅔ H;
   step 5: removing the wafer from the etching chamber, rotating the wafer for 90°, then placing the wafer on the electrostatic chuck of the etching chamber again, and enabling the fourth quadrant of the wafer to face to the cantilever of the etching machine; then continuously and synchronously etching the STI areas of the pixel areas and the logical areas of the first quadrant, the second quadrant, the third quadrant and the fourth quadrant of the wafer till the depth reaches ¾ H;
   step 6: removing the wafer from the etching chamber, rotating the wafer for 90°, then placing the wafer on the electrostatic chuck of the etching chamber again, and enabling the third quadrant of the wafer to face to the cantilever of the etching machine; then continuously and synchronously etching the STI areas of the pixel areas and the logical areas of the first quadrant, the second quadrant, the third quadrant and the fourth quadrant of the wafer till the depth reaches H;
   step 7: removing the wafer from the etching machine, and covering the STI areas of the pixel areas of the first quadrant, the second quadrant, the third quadrant and the fourth quadrant of the wafer with a photoresist;
   step 8: placing the wafer on the electrostatic chuck of the etching chamber of the etching machine, and enabling the second quadrant of the wafer to face to the cantilever of the etching machine; then continuously etching the STI areas of the logical areas of the first quadrant, the second quadrant, the third quadrant and the fourth quadrant of the wafer till the depth reaches $H+¼ h$;

step 9: removing the wafer from the etching chamber, rotating the wafer for 90°, then placing the wafer on the electrostatic chuck of the etching chamber again, and enabling the first quadrant of the wafer to face to the cantilever of the etching machine; then continuously etching the STI areas of the logical areas of the first quadrant, the second quadrant, the third quadrant and the fourth quadrant of the wafer till the depth reaches $H+2/4 h$;

step 10: removing the wafer from the etching chamber, rotating the wafer for 90°, then placing the wafer on the electrostatic chuck of the etching chamber again, and enabling the fourth quadrant of the wafer to face to the cantilever of the etching machine; then continuously etching the STI areas of the logical areas of the first quadrant, the second quadrant, the third quadrant and the fourth quadrant of the wafer till the depth reaches $H+¾ h$; and step 11: removing the wafer from the etching chamber, rotating the wafer for 90°, then placing the wafer on the electrostatic chuck of the etching chamber again, and enabling the third quadrant of the wafer to face to the cantilever of the etching machine; then continuously etching the STI areas of the logical areas of the first quadrant, the second quadrant, the third quadrant and the fourth quadrant of the wafer till the depth reaches $H+h$.

* * * * *